United States Patent
Lin (10) Patent No.: US 9,345,171 B2
(45) Date of Patent: May 17, 2016

(54) HEAT SINK RETAINER UNIT AND THERMAL MODULE DEVICE

(71) Applicant: ASIA VITAL COMPONENTS CO., LTD., New Taipei (TW)

(72) Inventor: Sheng-Huang Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 223 days.

(21) Appl. No.: 14/250,367

(22) Filed: Apr. 10, 2014

(65) Prior Publication Data

US 2015/0296654 A1 Oct. 15, 2015

(51) Int. Cl.
*H05K 7/20* (2006.01)
*H01L 23/40* (2006.01)

(52) U.S. Cl.
CPC .......... *H05K 7/2039* (2013.01); *H01L 23/4093* (2013.01)

(58) Field of Classification Search
CPC ............................... H01L 23/40; H05K 7/2039
USPC ........ 361/679.46–679.54, 688–723; 165/80.3, 138, 185; 248/221.11, 248/222.11, 222.13
See application file for complete search history.

(56) References Cited

U.S. PATENT DOCUMENTS

| | | | |
|---|---|---|---|
| 7,564,689 B1* | 7/2009 | Guo | H01L 23/4093 165/185 |
| 2005/0237720 A1* | 10/2005 | Li | H01L 23/4093 361/704 |
| 2006/0133038 A1* | 6/2006 | Yu | H01L 23/4093 361/697 |
| 2007/0025083 A1* | 2/2007 | Lin | H01L 23/4093 361/704 |
| 2007/0195507 A1* | 8/2007 | Lu | H01L 23/4093 361/720 |
| 2008/0010788 A1* | 1/2008 | Chen | H01L 23/4093 24/455 |
| 2008/0106869 A1* | 5/2008 | Li | H01L 23/4093 361/704 |
| 2008/0273309 A1* | 11/2008 | Lin | H01L 23/4093 361/718 |
| 2008/0298013 A1* | 12/2008 | Li | H01L 23/4093 361/688 |
| 2009/0236075 A1* | 9/2009 | Li | H01L 23/4093 165/80.2 |
| 2010/0181059 A1* | 7/2010 | Lin | F28D 15/0266 165/185 |
| 2010/0230077 A1* | 9/2010 | Cao | H01L 23/467 165/121 |

* cited by examiner

*Primary Examiner* — Anthony Haughton
*Assistant Examiner* — Yahya Ahmad (57) ABSTRACT

A heat sink retainer unit includes a buckle body, a retainer member, an elastic member and a handle. The elastic member is disposed in the buckle body and fitted on the retainer member. The retainer member is passed through the buckle body from a lower side thereof. A top end of the retainer member is positioned above the buckle body. The handle is positioned above the buckle body and pivotally connected with the top end of the retainer member. By means of operating the handle, the retainer member can be moved up and down, whereby the elastic member can apply elastic force to the buckle body.

12 Claims, 12 Drawing Sheets

HEAT SINK RETAINER UNIT AND THERMAL MODULE DEVICE

BACKGROUND OF THE INVENTION

1. Field of the Invention

The present invention relates generally to a heat sink retainer unit, and more particularly to a heat sink retainer unit for fixedly mounting a heat sink on an electronic component and a thermal module device employing the heat sink retainer unit.

2. Description of the Related Art

In recent years, along with the rapid development of electronic industries, the operation speed of the electronic components has been continuously enhanced. In operation, the electronic components will generate a great amount of heat to lead to rise of temperature of the electronic components themselves and the entire system. This will affect the stability of the system. In order to ensure normal operation of the electronic components, generally a heat dissipation device is mounted on the electronic components to dissipate the heat generated by the electronic components.

Currently, in general, a heat sink is mounted on each heat generation electronic component to solve the heat dissipation problem thereof. The heat sink includes a substrate in close contact with the electronic component and multiple radiating fins disposed on the substrate. There are many ways to fix the heat sink. In order to tightly attach the heat sink to the surface of the heat generation electronic component, generally a retainer unit is used to fix the heat sink on the electronic component. In general, a fixing seat is disposed on the circuit board and the retainer unit is latched with the fixing seat to press the heat sink against the heat generation electronic component so as to tightly attach the heat sink to the surface of the heat generation electronic component.

For example, a prior heat sink retainer unit includes a first retainer member, a second retainer member and a handle. The first retainer member has a downward pressable elastic arm. One end of the elastic arm is bent and extended to form a first retainer leg. The other end of the elastic arm has a support face. The second retainer member is disposed at one end of the first retainer member with the support face. The handle is connected with the second retainer member. A cam is disposed at one end of the handle for pressing the support face. A protrusion is formed at a free end of the cam. When the cam is rotated, the protrusion slides from one side of the second retainer member to the opposite side to engage with a lateral edge of the second retainer member. In addition, an edge of the cam that is into contact with the support face when the cam is rotated is formed with a folded edge.

However, along with the advance of the digital information technologies, nowadays, there is a trend to develop lighter, thinner and smaller electronic products. Therefore, it is hard to operate the heat sink retainer unit within a limited (narrowed) space to fix the heat sink. It is therefore tried by the applicant to provide a heat sink retainer unit, which can be easily operated within a limited space to fix the heat sink.

SUMMARY OF THE INVENTION

It is therefore a primary object of the present invention to provide a heat sink retainer unit and a thermal module device, which can be quickly installed or uninstalled without using any hand tool.

It is a further object of the present invention to provide the above heat sink retainer unit, which includes an elastic member for applying elastic latching force to the heat sink so as to facilitate the operation and keep the heat sink in tight contact with a heat generation electronic component.

To achieve the above and other objects, the heat sink retainer unit of the present invention includes: a buckle body having a top face and a bottom face, the top face being formed with a pair of perforations, a support face being formed between the two perforations, the bottom face being formed with a receiving cavity in communication with the perforations; a retainer member having a first plate body and a second plate body, top ends of the first and second plate bodies being respectively formed with two pivot holes in alignment with each other, the first and second plate bodies respectively corresponding to the perforations, the first and second plate bodies being respectively passed through the perforations from lower side of the buckle body to position the pivot holes above the support face, a bottom end of the first plate body being connected with a latch leg, the latch leg being formed with at least one latch hole; an elastic member received in the receiving cavity of the buckle body, the elastic member being fitted on the first and second plate bodies of the retainer member; and a handle having a shift arm and a cam connected with one end of the shift arm, the other end of the shift arm being a free end, the cam having an eccentric guide slot and an abutment face formed on outer circumference of the cam, the cam being positioned above the support face between the first and second plate bodies, a pivot member being passed through the pivot holes and the guide slot to pivotally connect the cam with the retainer member with the abutment face in contact with the support face of the buckle body.

The heat dissipation device of the present invention includes: a fixing seat, two protrusion blocks being respectively disposed on two opposite outer sides of the fixing seat; a heat sink disposed on the fixing seat, the heat sink including a substrate and a radiating fin assembly assembled on the substrate, two platforms respectively outward protruding from two opposite sides of the substrate, each platform being formed with a socket, a bottom of the socket being formed with a through hole passing through the platform; and a heat sink retainer unit disposed on at least one side of the heat sink, the heat sink retainer unit including: a buckle body having a top face and a bottom face, the top face being formed with a pair of perforations, a support face being formed between the two perforations, the bottom face being formed with a receiving cavity in communication with the perforations and in alignment with the socket of the platform; a retainer member having a first plate body and a second plate body, top ends of the first and second plate bodies being respectively formed with two pivot holes in alignment with each other, the first and second plate bodies respectively corresponding to the perforations, the first and second plate bodies being passed through the through hole from lower side of the platform and then respectively passed through the perforations from lower side of the buckle body to position the pivot holes above the support face, a bottom end of the first plate body being connected with a latch leg, the latch leg being formed with at least one latch hole for latching with at least one protrusion block of the fixing seat; an elastic member received in the receiving cavity of the buckle body and positioned between the receiving cavity and the socket of the platform, the elastic member being fitted on the first and second plate bodies of the retainer member; and a handle having a shift arm and a cam connected with one end of the shift arm, the other end of the shift arm being a free end, the cam having an eccentric guide slot and an abutment face formed on outer circumference of the cam, the cam being positioned above the support face between the first and second plate bodies, a pivot member being passed through the pivot holes and the guide slot to pivotally connect the cam with the retainer member with the abutment face in contact with the support face of the buckle body.

In the above heat dissipation device, the fixing seat is mounted on a circuit board on which an electronic component is disposed. The fixing seat includes two seat bodies symmetrically disposed on two sides of the electronic component. The two protrusion blocks are disposed on two opposite outer sides of the two seat bodies. Two opposite sides of the radiating fin assembly are respectively formed with two recesses. Two restriction sections are disposed on the substrate corresponding to the recesses respectively.

In the above heat dissipation device, the bottom sections of the first and second plate bodies are connected via a connection plate body. The support face is a downward recessed arched face in adaptation to the abutment face. The first and second plate bodies are parallel to each other. The perforations are parallel to each other.

The heat sink retainer unit of the present invention can be easily and quickly operated in a limited space to latch or unlatch the heat sink. Accordingly, the heat sink can be quickly and easily installed or uninstalled.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The embodiments of the present invention will be described hereinafter with reference to the drawings, wherein the same components are denoted with the same reference numerals.

Figure 1:
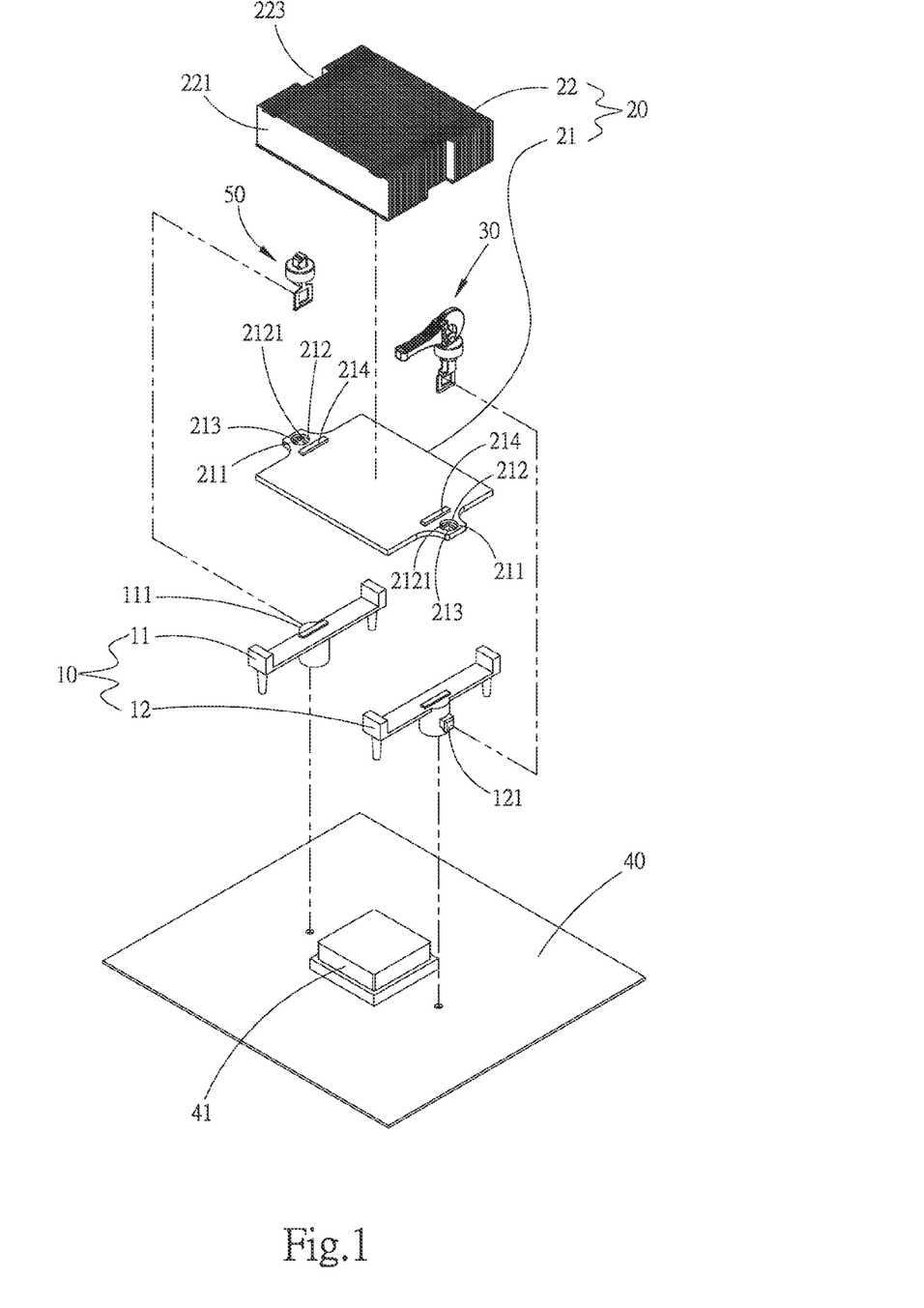
FIG. 1 is a perspective exploded view of the thermal module device of the present invention.
Figure 2:
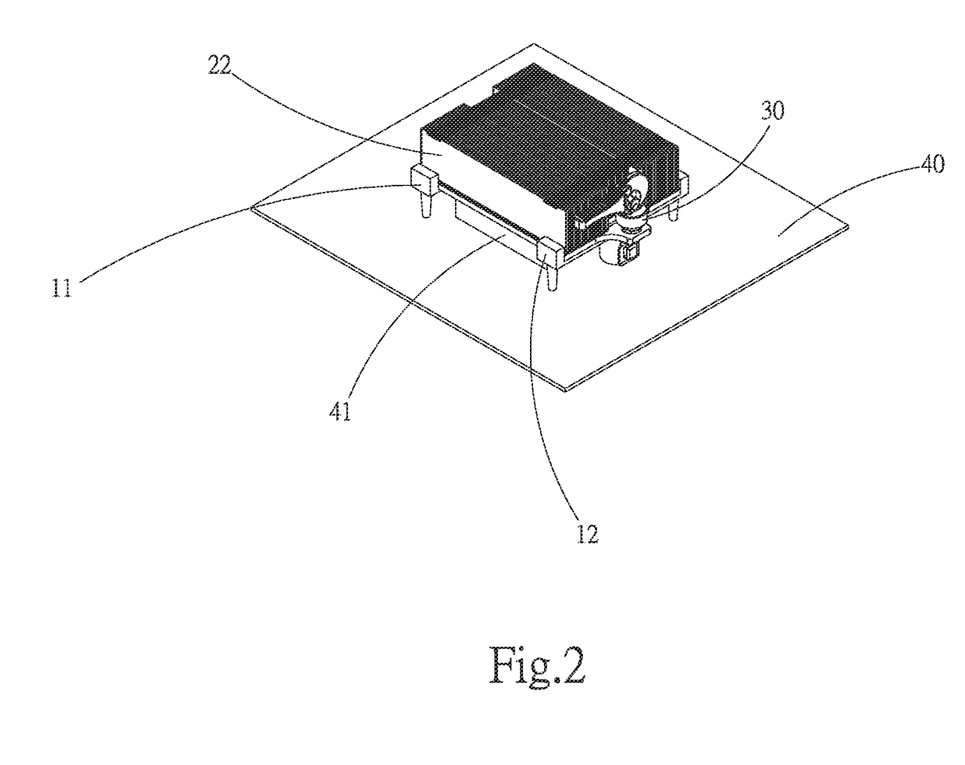
FIG. 2 is a perspective assembled view of the thermal module device of the present invention.

Please refer to FIGS. 1 and 2. FIG. 1 is a perspective exploded view of the thermal module device of the present invention. FIG. 2 is a perspective assembled view of the thermal module device of the present invention. The thermal module of the present invention includes a fixing seat 10, a heat sink 20 and a heat sink retainer unit 30. The fixing seat 10 is mountable on a circuit board 40. The heat sink 20 is attached to the surface of a heat generation electronic component 41 on the circuit board 40. The heat sink retainer unit 30 is disposed on at least one side of the heat sink 20. Another heat sink retainer unit 50 is disposed on the other side of the heat sink 20. The heat sink retainer unit 30 and the other heat sink retainer unit 50 are latched with the fixing seat 10 to make the heat sink 20 in tight contact with the surface of the heat generation electronic component 41. Accordingly, the heat generated by the heat generation electronic component 41 can be dissipated by the heat sink 20.

The fixing seat 10 includes two seat bodies 11, 12 symmetrically disposed on two opposite sides of the heat generation electronic component 41. The two seat bodies 11, 12 are fixed on the circuit board 40 by means of screwing or engagement. Two opposite outer sides of the two seat bodies 11, 12 respectively have two outward protrusion blocks 111, 121 for latching with the heat sink retainer unit 30 and the other heat sink retainer unit 50.

The heat sink 20 is disposed on the fixing seat 10, including a substrate 21 and a radiating fin assembly 22. The substrate 21 is positioned on the fixing seat 10 with a lower surface of the substrate 21 attaching to an upper surface of the heat generation electronic component 41 for absorbing the heat generated by the heat generation electronic component 41. Two platforms 211 respectively outward protrude from two opposite sides of the substrate 21. Each platform 211 is formed with a socket 212. The bottom 2121 of the socket 212 is formed with a through hole 213 passing through the platform 211. Two restriction sections 214 are oppositely disposed on the upper surface of the substrate 21. In this embodiment, the radiating fin assembly 22 includes multiple radiating fins 221. The radiating fin assembly 22 is vertically disposed on the upper surface of the substrate 21 and fixed with the substrate 21 by means of welding or the like. The multiple radiating fins 221 of the radiating fin assembly 22 are parallel to each other. Each two adjacent radiating fins 221 define an airflow passage therebetween. Two opposite sides of the radiating fin assembly 22 are respectively formed with two recesses 223 corresponding to the restriction sections 214. By means of the restriction sections 214, the radiating fin assembly 22 is located on the substrate 21 with the radiating fins 221 uniformly distributed over the upper surface of the substrate 21. In another embodiment, the radiating fin assembly 22 further includes multiple heat pipes (not shown) passing through the radiating fins.

Figure 3A:
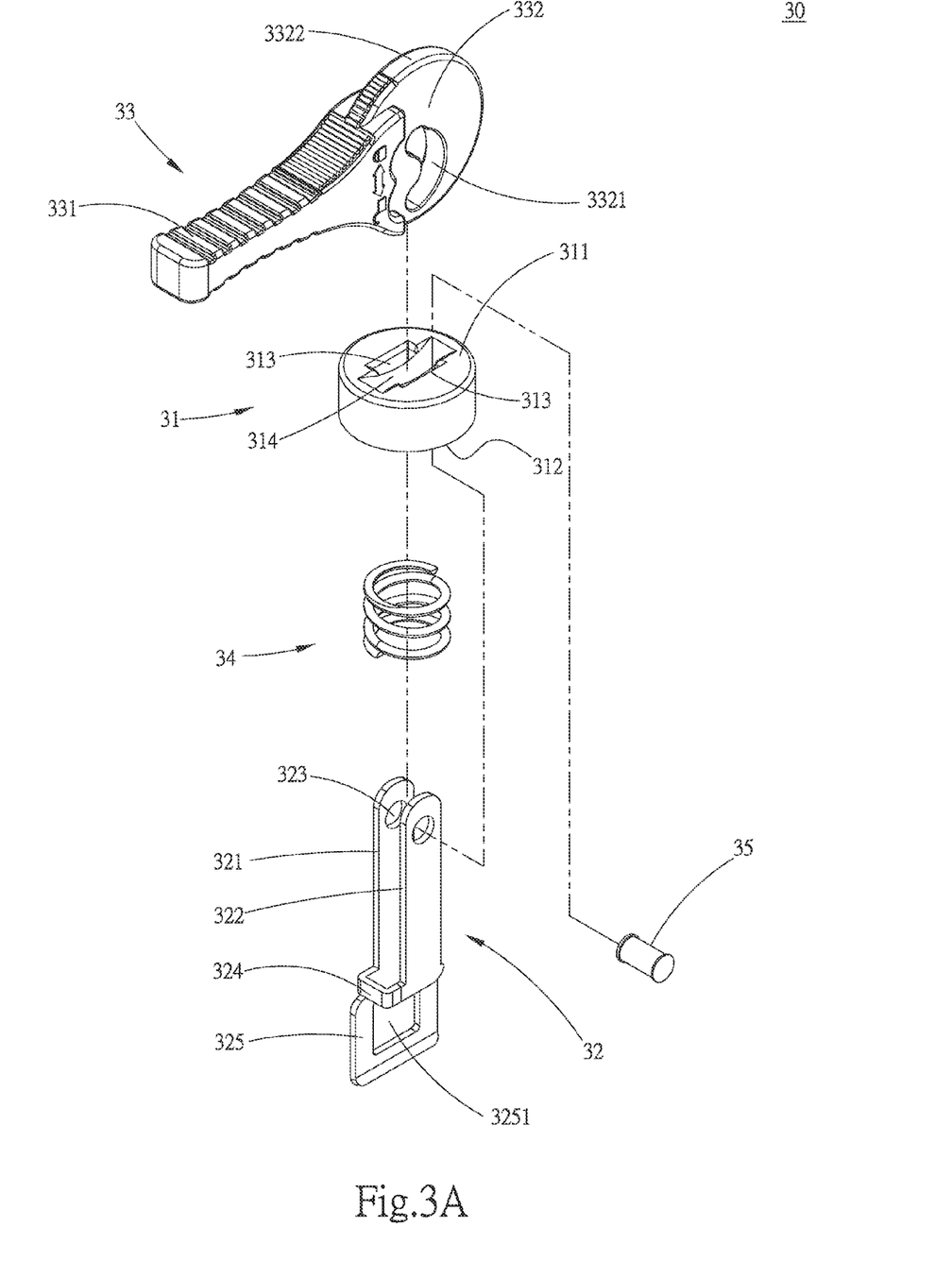
FIG. 3A is a perspective exploded view of the heat sink retainer unit of the present invention.
Figure 3B:
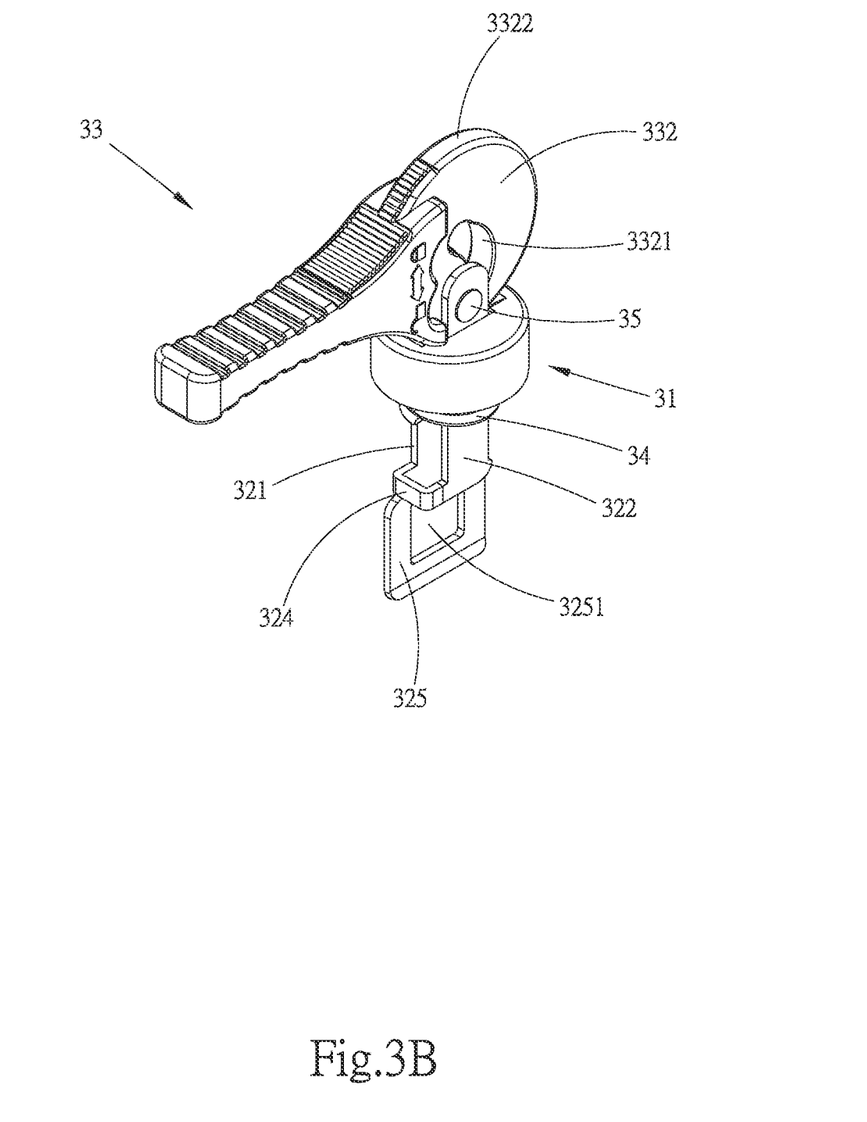
FIG. 3B is a perspective assembled view of the heat sink retainer unit of the present invention.
Figure 3C:
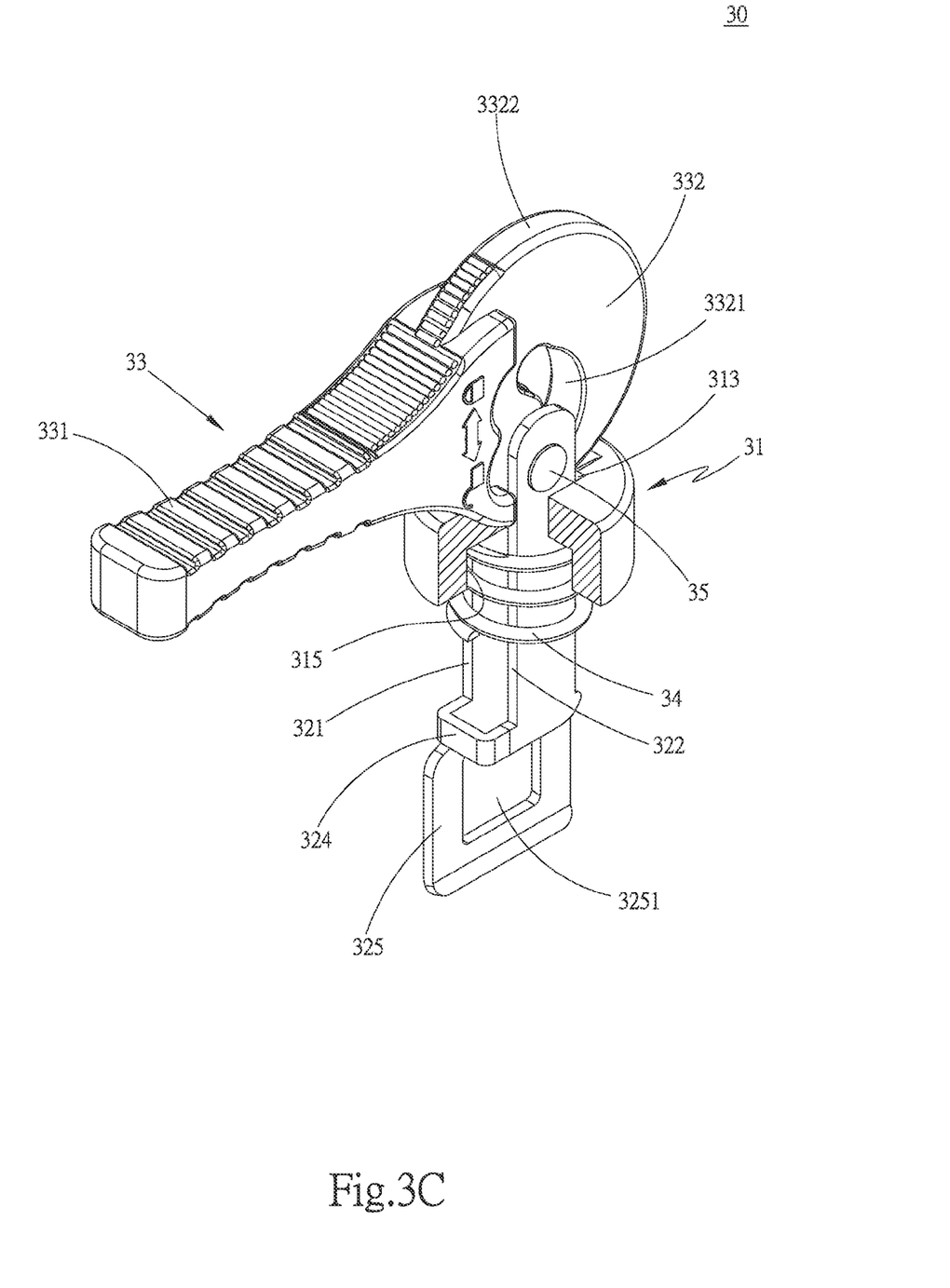
FIG. 3C is a sectional assembled view of the heat sink retainer unit of the present invention.

Please now refer to FIGS. 3A, 3B and 3C. The heat sink retainer unit 30 includes a buckle body 31, a retainer member 32, a handle 33, an elastic member 34 and a pivot member 35. The pivot member 35 is a cylindrical pivot pin.

The buckle body 31 has a top face 311 and a bottom face 312. The top face 311 is formed with a pair of perforations 313 in parallel to each other. A support face 314 is formed between the two perforations 313. The support face 314 is a downward recessed arched face. The bottom face 312 is formed with a receiving cavity 315 in communication with the perforations 313.

The retainer member 32 has a first plate body 321 and a second plate body 322 in parallel to each other. The top ends of the first and second plate bodies 321, 322 are respectively formed with two pivot holes 323 in alignment with each other. The pivot member 35 is passed through the pivot holes 323. The first and second plate bodies 321, 322 respectively correspond to the perforations 313. The first and second plate bodies 321, 322 are respectively passed through the perforations 313 from lower side of the buckle body 31 to position the pivot holes 323 above the support face 314. The bottom sections of the first and second plate bodies 321, 322 are connected via a connection plate body 324. The bottom end of the first plate body 321 is connected with a latch leg 325. The latch leg 325 is formed with at least one latch hole 3251 for latching with the fixing seat 10. The retainer member 32 is integrally made from a metal plate body by means of punch. The configuration of the retainer member 32 is not limited to the configuration shown in the drawings. Alternatively, the retainer member 32 can be a reverse T-shaped plate body. Also, the latch leg 325 can be formed with multiple fitting holes. Correspondingly, the two seat bodies 11, 12 of the fixing seat 10 are formed with multiple protrusion blocks corresponding to the fitting holes.

The elastic member 34 is a compression spring received in the receiving cavity 315 of the buckle body 31. The elastic member 34 is fitted on the first and second plate bodies 321, 322 of the retainer member 32.

The handle 33 has a shift arm 331 and a cam 332 connected with one end of the shift arm 331. The other end of the shift arm 331 is a free end for a user to hold and operate. The cam 332 has an eccentric guide slot 3321 through which the pivot member 35 is passed. The cam 332 also has an abutment face 3322 formed on outer circumference of the cam 332. The cam 332 is positioned above the support face 314 between the first and second plate bodies 321, 322 in alignment with the pivot hole 323.

The retainer unit 30 is mounted on one side of the heat sink 20 in such a manner that the buckle body 31 is disposed on the platform 211 of the substrate 21 with the bottom face 312 of the buckle body 31 in alignment with the platform 211. The elastic member 34 is disposed in the receiving cavity 315 of the buckle body 31 and positioned between the receiving cavity 315 and the socket 212 of the platform 211. The first and second plate bodies 321, 322 of the retainer member 32 are passed through the through hole 213 and the socket 212 from the lower side of the platform 211 and then passed through the perforations 313 from the lower side of the buckle body 31 respectively to position the two pivot holes 323 above the support face 314. Then the pivot member 35 is passed through the pivot holes 323 and the guide slot 3321 to pivotally connect the handle 33 with the retainer member 32. The abutment face 3322 of the cam 332 abuts against the support face 314 of the buckle body 31. Two ends of the pivot member 35 can be riveted to prevent the pivot member 35 from detaching out of the pivot holes 323 and the guide slot 3321.

Figure 4A:
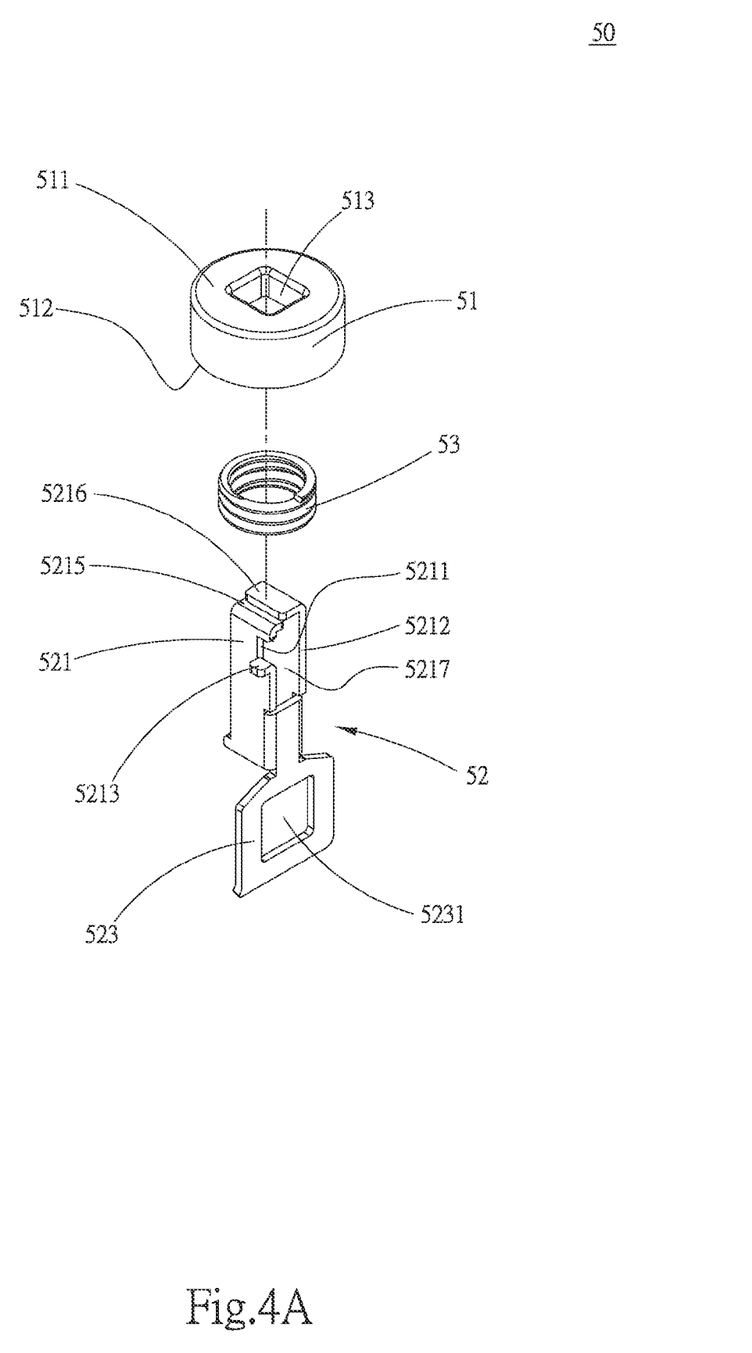
FIG. 4A is a perspective exploded view of the other heat sink retainer unit of the present invention.
Figure 4B:
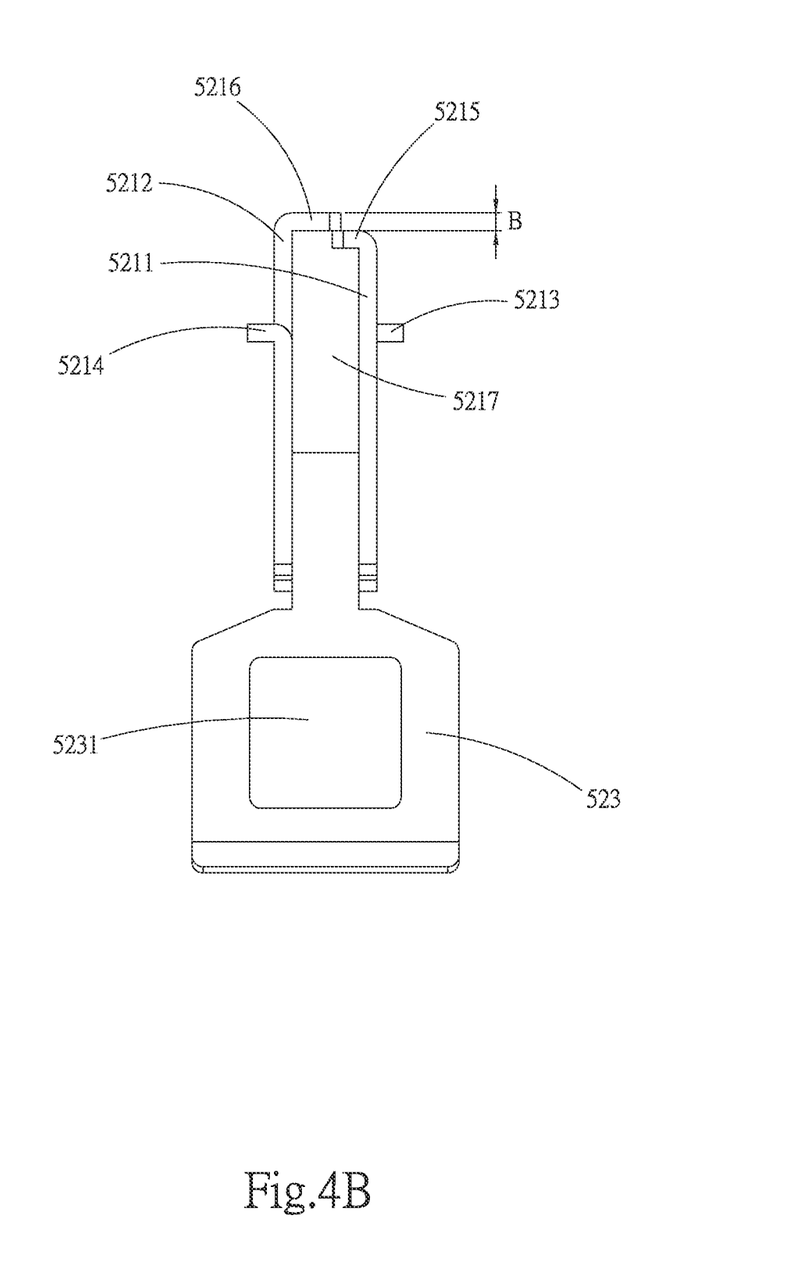
FIG. 4B is a perspective assembled view of the other heat sink retainer unit of the present invention.
Figure 4C:
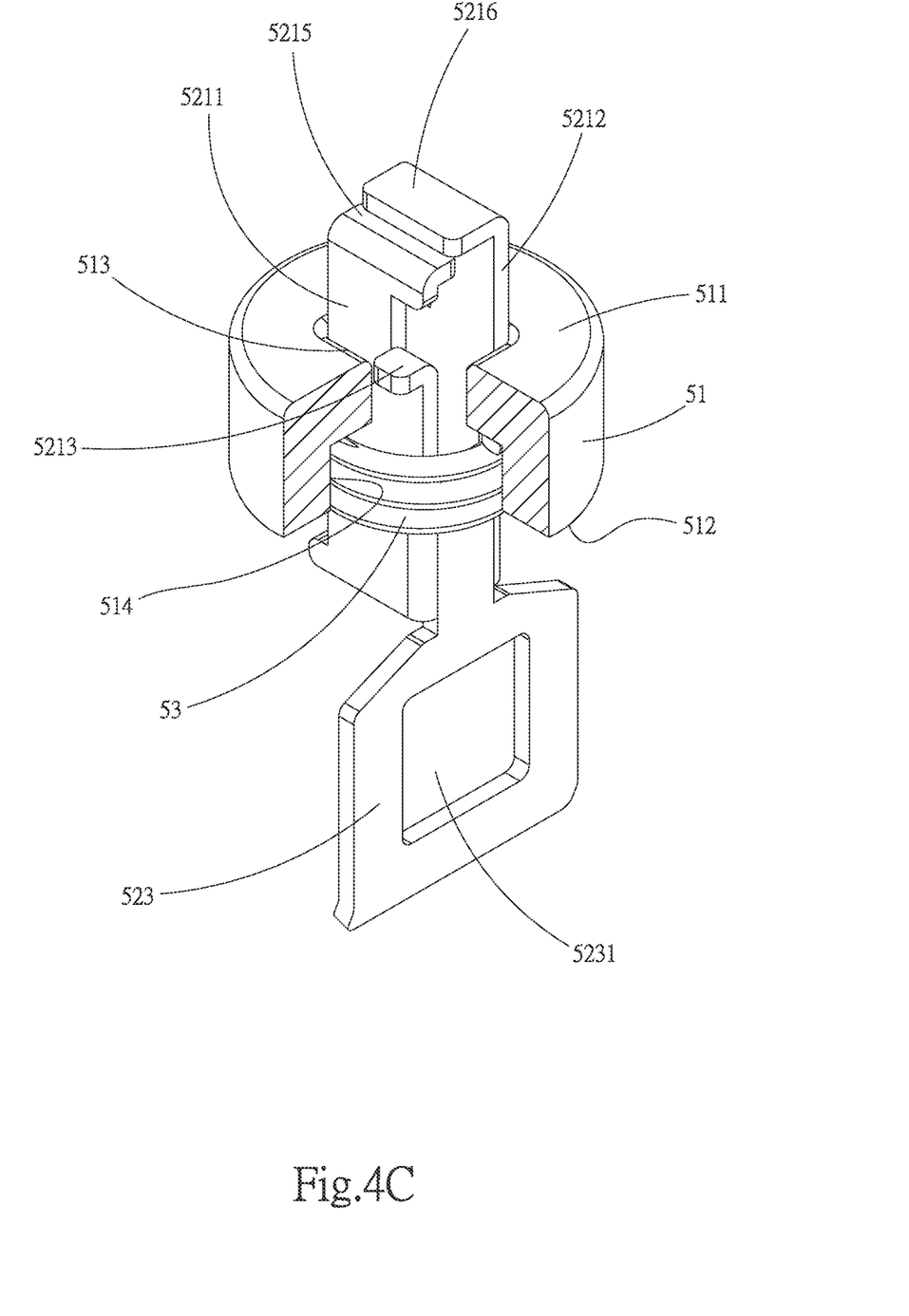
FIG. 4C is a sectional assembled view of the other heat sink retainer unit of the present invention.

Please now refer to FIGS. 4A, 4B and 4C. The other heat sink retainer unit 50 includes a collar 51, a retainer member 52 and an elastic member 53. The collar 51 has a top face 511 and a bottom face 512. The top face 511 is formed with a shaft hole 513. The bottom face 512 is formed with a receiving cavity 514 in communication with the shaft hole 513. The retainer member 52 has an operation section 521 and a downward extending latch leg 523. The latch leg 523 is formed with a fitting hole 5231. The operation section 521 is passed through the shaft hole 513 and the receiving cavity 514 of the collar 51. The operation section 521 has a first folded plate 5211 and a second folded plate 5212 opposite to each other. A space 5217 is defined between the first and second folded plates 5211, 5212. A middle section of the first folded plate 5211 is formed with a first engagement section 5213. In addition, a first shoulder section 5215 is formed at top end of the first folded plate 5211. A middle section of the second folded plate 5212 is formed with a second engagement section 5214. A second shoulder section 5216 is formed at top end of the second folded plate 5212. The first and second engagement sections 5213, 5214 abut against the top face of the collar 51. The first folded plate 5211 has a height lower than a height of the second folded plate 5212. The first shoulder section 5215 of the top end of the first folded plate 5211 is bent toward the second folded plate 5212. The second shoulder section 5216 of the top end of the second folded plate 5212 is bent toward the first folded plate 5211. The first shoulder section 5215 is positioned below the second shoulder section 5216. A height difference B is defined between the first and second shoulder sections 5215, 5216. The elastic member 53 is a compression spring received in the receiving cavity 514 and fitted on the operation section 521 of the retainer member 52.

The retainer unit 50 is mounted on the other side of the heat sink 20 in such a manner that the collar 51 is disposed on the other platform 211 of the substrate 21 with the bottom face 512 of the collar 51 in alignment with the platform 211. The elastic member 53 is disposed between the receiving cavity 314 of the collar 51 and the socket 212 of the platform 211. The top end of the retainer member 52 is passed through the through hole 213 of the platform 211 from the lower side of the platform 211 and then passed through the receiving cavity 514 and shaft hole 513 of the collar 51. The elastic member 53 is fitted on the operation section 521.

Figure 5A:
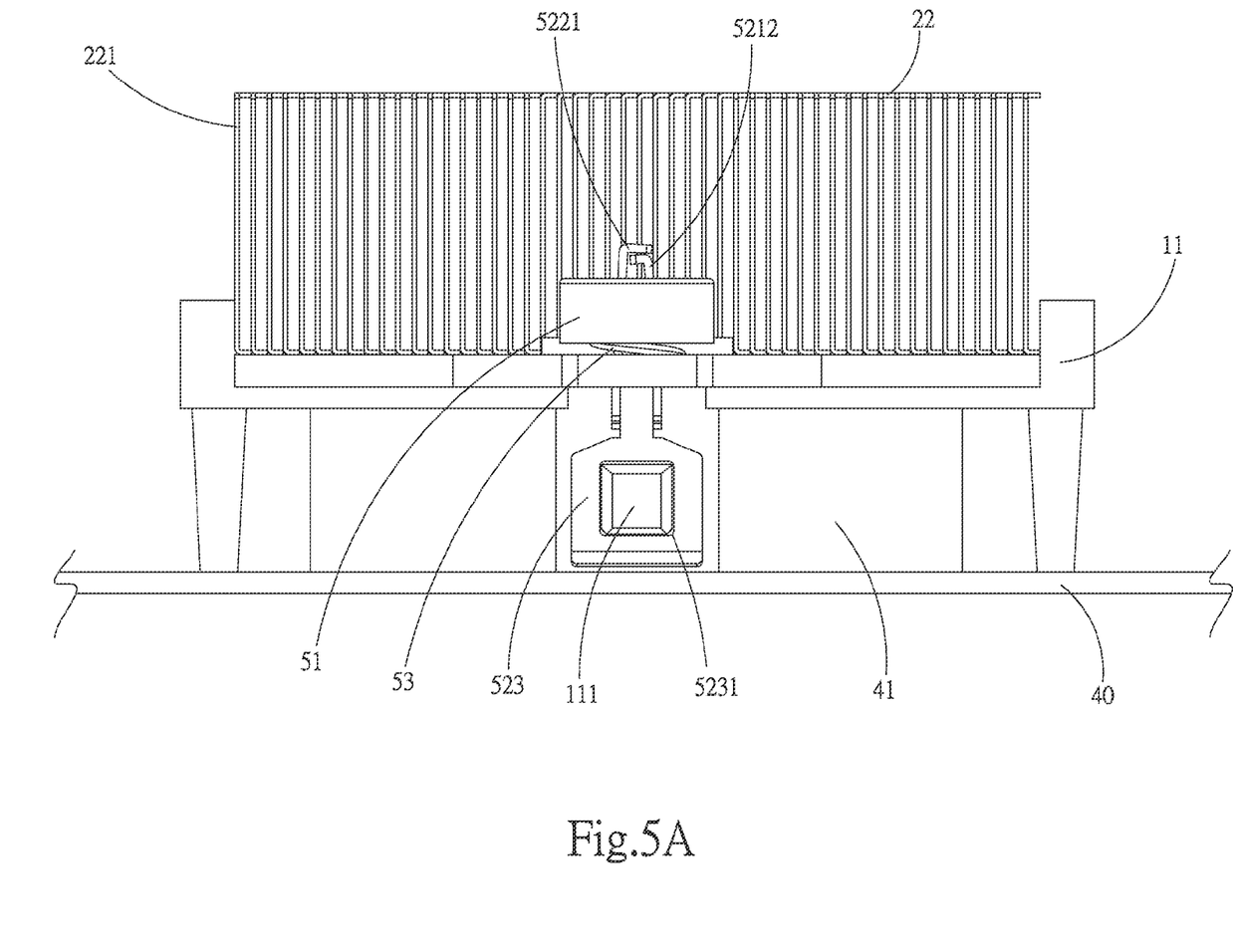
FIG. 5A is a view showing that the other heat sink retainer unit unlatches the protrusion block.
Figure 5B:
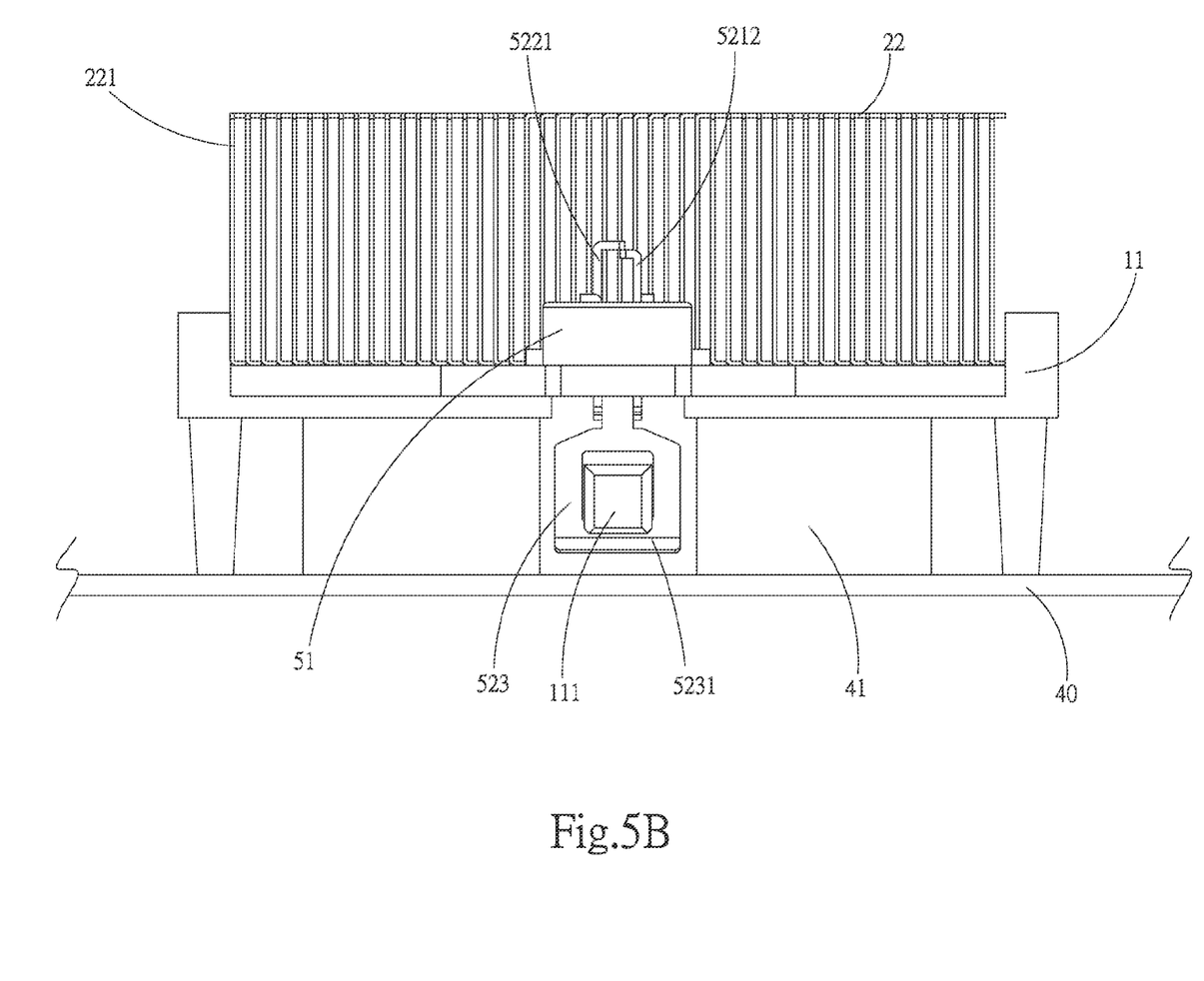
FIG. 5B is a view showing that the other heat sink retainer unit latches the protrusion block.

Please refer to FIGS. 5A and 5B. FIG. 5A is a view showing that the other heat sink retainer unit 50 unlatches the protrusion block. FIG. 5B is a view showing that the other heat sink retainer unit 50 latches the protrusion block. The heat sink 20 is positioned on the fixing seat 10. The protrusion block 111 disposed on outer side of the seat body 11 is fitted in the fitting hole 5231 of the latch leg 523 of the other heat sink retainer unit 50 on one side of the heat sink 20. The collar 51 is pressed downward from the top face 511 of the collar 51 to make the first and second engagement sections 5213, 5214 latch the top face 511 of the collar 51. At the same time, the retainer member 52 is lifted and the protrusion block 111 is tightly latched in the fitting hole 5231 with the elastic member 53 in a compressed state.

When it is desired to release the other heat sink retainer unit 50, action force is applied to outer sides of the first and second folded plates 5211, 5212 to make the first and second folded plates 5211, 5212 move toward each other to narrow the space 5217. Under such circumstance, the first and second engagement sections 5213, 5214 are unlatched from the top face 511 of the collar 51. At this time, the elastic member 53 elastically restores to apply an elastic force to the collar 51 to make the collar 51 move upward. Simultaneously, the retainer member 52 is moved downward to retract the first and second engagement sections 5213, 5214 into the shaft hole 513. Under such circumstance, the protrusion block 111 is unlatched from the fitting hole 5213.

Figure 6A:
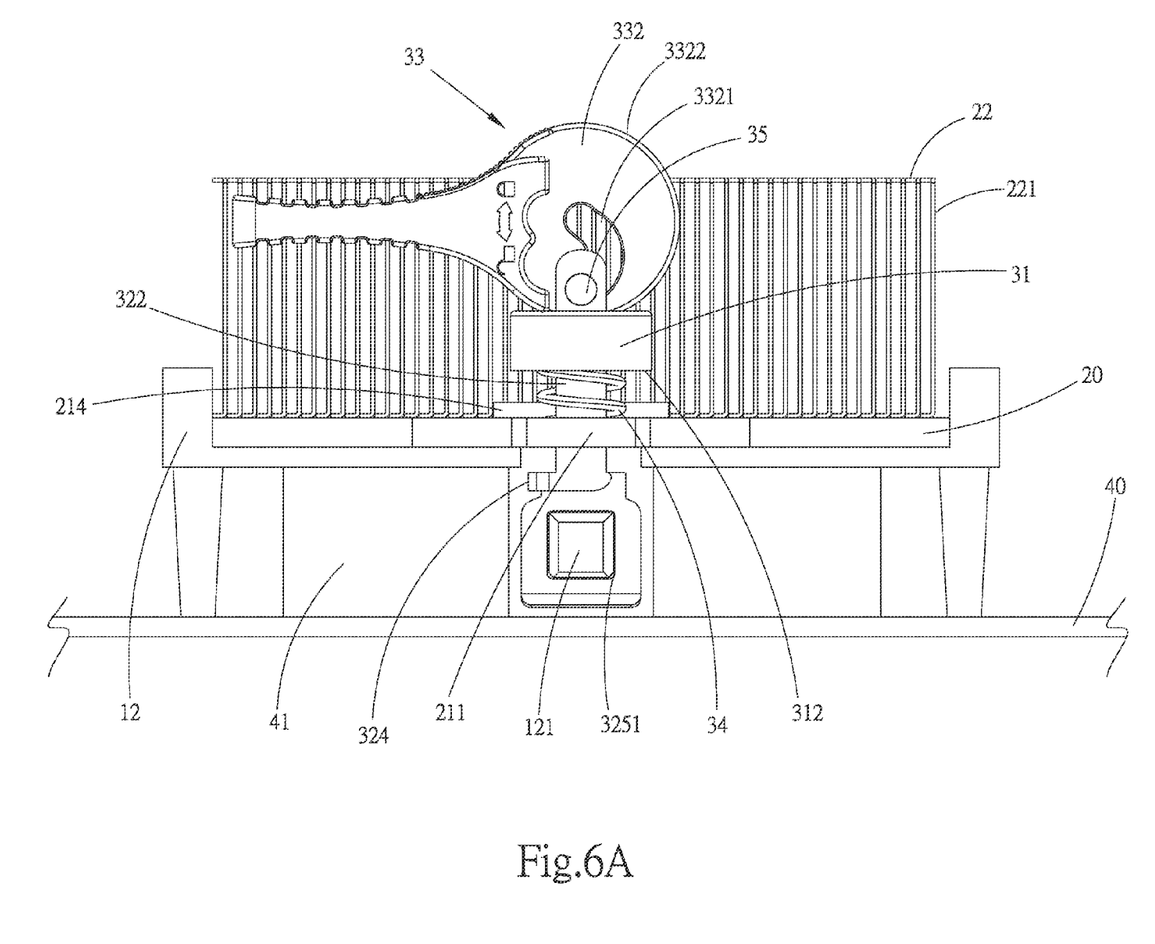
FIG. 6A is a view showing that the heat sink retainer unit unlatches the protrusion block.
Figure 6B:
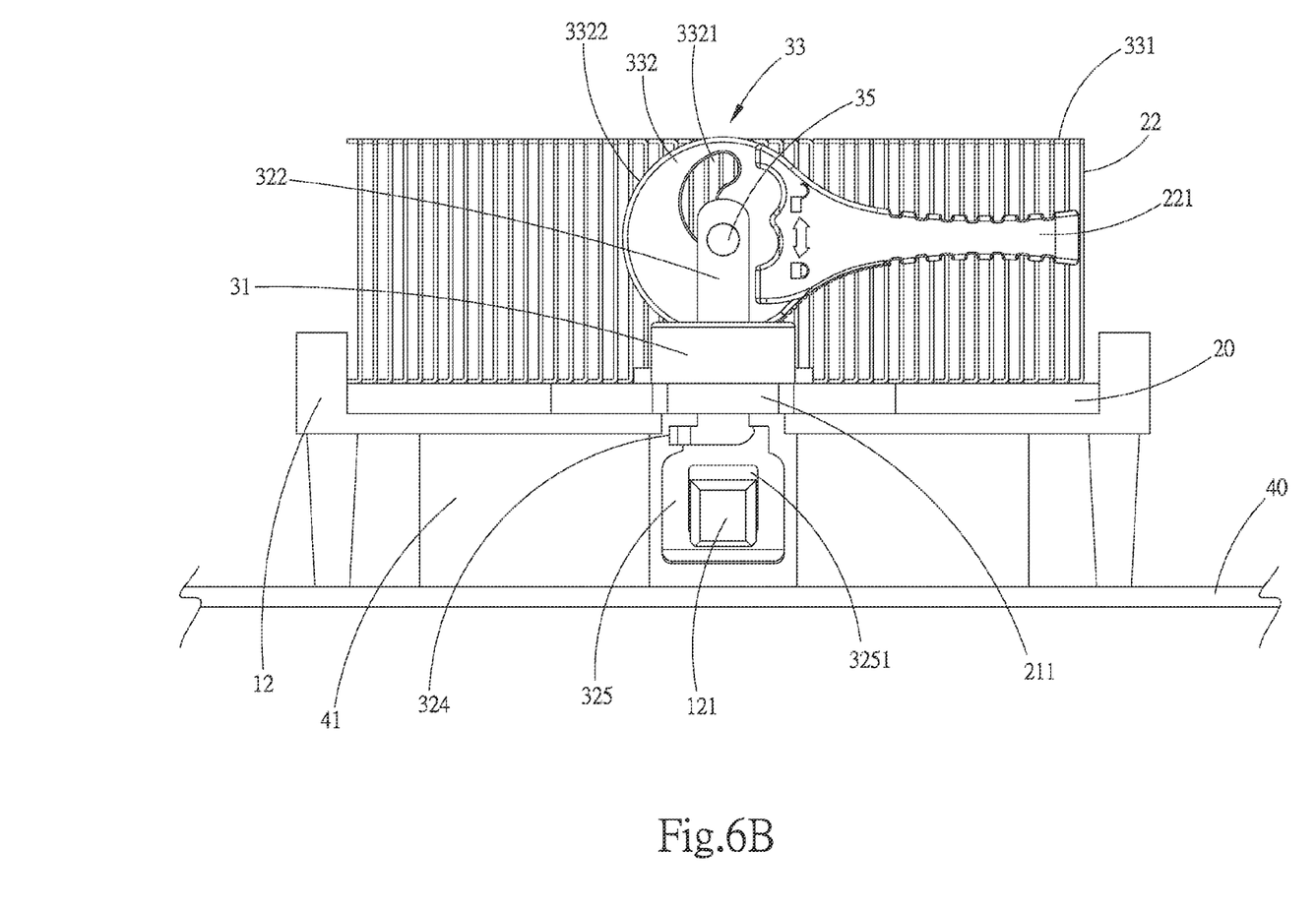
FIG. 6B is a view showing that the heat sink retainer unit latches the protrusion block.

Please now refer to FIGS. 6A and 6B. FIG. 6A is a view showing that the heat sink retainer unit 30 unlatches the protrusion block. FIG. 6B is a view showing that the heat sink retainer unit 30 latches the protrusion block. The protrusion block 121 disposed on outer side of the seat body 12 is fitted in the latch hole 3251 of the latch member 32 of the heat sink retainer unit 30 in an unlatched state (as shown in FIG. 6A). At this time, the shift arm 331 of the handle 33 is positioned above the buckle body 31 on the left side of the drawing. The pivot member 35 is positioned at one end of the guide slot 3321. The elastic member 34 is positioned under the buckle body 31 between the receiving cavity 315 and the socket 212 of the platform 211 in an uncompressed state. The bottom face 312 of the buckle body 31 is spaced from the upper surface of the platform 211 by a certain distance as an up and down move travel of the retainer member 32.

When the shift arm 331 is shifted to the right side of the drawing (as shown in FIG. 6B), the cam 332 is driven and rotated. At this time, the pivot member 35 is relatively moved to the other end of the guide slot 3321 until the shift arm 331 reaches the right side of the drawing (as shown in FIG. 6B). Along with the move of the pivot member 35 within the guide slot 3321, the retainer member 32 is lifted to make the protrusion block 121 tightly latched in the latch hole 3251. The abutment face 3322 of the cam 332 abuts against and moves along the support face 314 of the buckle body 31 to press down the buckle body 31, whereby the bottom face 312 of the buckle body 31 abuts against the platform 211. At this time, the elastic member 34 positioned between the receiving cavity 315 and the socket 212 of the platform 211 is compressed.

When it is desired to release the heat sink retainer unit 30, the shift arm 331 of the handle 30 is shifted to the left side of the drawing (as shown in FIG. 6A) to drive and rotate the cam 332. At this time, the pivot member 35 is relatively moved to the original end of the guide slot 3321 until the shaft arm 331 reaches the left side of the drawing (as shown in FIG. 6A). Along with the move of the pivot member 35 within the guide slot 3321, the retainer member 32 is lowered to make the protrusion block 121 unlatched from the latch hole 3251. The abutment face 3322 of the cam 332 abuts against and moves along the support face 314 of the buckle body 31 back to its original position, whereby the elastic member 34 elastically restores to the uncompressed state to apply an elastic force to the buckle body 31 to restore the buckle body 31 to its original position.

By means of the elastic member 34, the heat sink retainer unit 30 applies a good elastic latching force to the heat sink so as to keep the heat sink in tight contact with the heat generation electronic component 41. Moreover, the heat sink retainer unit 30 provides a better anti-impact ability to ensure that the heat sink 20 is in good contact with the heat generation electronic component 41 even after a long period of use. Accordingly, the heat transfer efficiency can be maintained.

In the above embodiment, two different heat sink retainer units 30, 50 are disposed on two sides of the heat sink 20. Alternatively, two identical heat sink retainer units 30 or two identical heat sink retainer units 50 can be respectively disposed on two sides of the heat sink 20.

In conclusion, the heat sink retainer unit of the present invention can be moved up and down to latch or unlatch the protrusion block by means of the elastic force of the elastic member. Therefore, the heat sink can be retained without using any hand tool. Accordingly, the heat sink can be quickly and easily installed or uninstalled in a limited space.

The present invention has been described with the above embodiments thereof and it is understood that many changes and modifications in the above embodiments can be carried out without departing from the scope and the spirit of the invention that is intended to be limited only by the appended claims.

What is claimed is:

1. A heat sink retainer unit comprising:
   a buckle body having a top face and a bottom face, the top face being formed with a pair of perforations, a support face being formed between the two perforations, the bottom face being formed with a receiving cavity in communication with the perforations;
   a retainer member having a first plate body and a second plate body, top ends of the first and second plate bodies being respectively formed with two pivot holes in alignment with each other, the first and second plate bodies respectively corresponding to the perforations, the first and second plate bodies being respectively passed through the perforations from lower side of the buckle body to position the pivot holes above the support face, a bottom end of the first plate body being connected with a latch leg, the latch leg being formed with at least one latch hole;
   an elastic member received in the receiving cavity of the buckle body, the elastic member being fitted on the first and second plate bodies of the retainer member; and
   a handle having a shift arm and a cam connected with one end of the shift arm, the other end of the shift arm being a free end, the cam having an eccentric guide slot and an abutment face formed on outer circumference of the cam, the cam being positioned above the support face between the first and second plate bodies, a pivot member being passed through the pivot holes and the guide slot to pivotally connect the cam with the retainer member with the abutment face in contact with the support face of the buckle body.

2. The heat sink retainer unit as claimed in claim 1, wherein bottom sections of the first and second plate bodies are connected via a connection plate body.

3. The heat sink retainer unit as claimed in claim 1, wherein the support face is a downward recessed arched face in adaptation to the abutment face.

4. The heat sink retainer unit as claimed in claim 2, wherein the first and second plate bodies are parallel to each other.

5. The heat sink retainer unit as claimed in claim 1, wherein the perforations are parallel to each other.

6. A heat dissipation device comprising:
   a fixing seat, two protrusion blocks being respectively disposed on two opposite outer sides of the fixing seat;
   a heat sink disposed on the fixing seat, the heat sink including a substrate and a radiating fin assembly assembled on the substrate, two platforms respectively outward protruding from two opposite sides of the substrate, each platform being formed with a socket, a bottom of the socket being formed with a through hole passing through the platform; and
   a heat sink retainer unit disposed on at least one side of the heat sink, the heat sink retainer unit including:
   a buckle body having a top face and a bottom face, the top face being formed with a pair of perforations, a support face being formed between the two perforations, the bottom face being formed with a receiving cavity in communication with the perforations and in alignment with the socket of the platform;
   a retainer member having a first plate body and a second plate body, top ends of the first and second plate bodies being respectively formed with two pivot holes in alignment with each other, the first and second plate bodies respectively corresponding to the perforations, the first and second plate bodies being passed through the through hole from lower side of the platform and then respectively passed through the perforations from lower side of the buckle body to position the pivot holes above the support face, a bottom end of the first plate body being connected with a latch leg, the latch leg being formed with at least one latch hole for latching with at least one protrusion block of the fixing seat;
   an elastic member received in the receiving cavity of the buckle body and positioned between the receiving cavity and the socket of the platform, the elastic member being fitted on the first and second plate bodies of the retainer member; and
   a handle having a shift arm and a cam connected with one end of the shift arm, the other end of the shift arm being a free end, the cam having an eccentric guide slot and an abutment face formed on outer circumference of the cam, the cam being positioned above the support face between the first and second plate bodies, a pivot member being passed through the pivot holes and the guide slot to pivotally connect the cam with the retainer member with the abutment face in contact with the support face of the buckle body.

7. The heat dissipation device as claimed in claim 6, wherein the fixing seat is mounted on a circuit board on which an electronic component is disposed, the fixing seat including two seat bodies symmetrically disposed on two sides of the electronic component, the two protrusion blocks being disposed on two opposite outer sides of the two seat bodies.

8. The heat dissipation device as claimed in claim 6, wherein two opposite sides of the radiating fin assembly are respectively formed with two recesses, two restriction sections being disposed on the substrate corresponding to the recesses respectively.

9. The heat dissipation device as claimed in claim 6, wherein bottom sections of the first and second plate bodies are connected via a connection plate body.

10. The heat dissipation device as claimed in claim 6, wherein the support face is a downward recessed arched face in adaptation to the abutment face.

11. The heat dissipation device as claimed in claim 6, wherein the first and second plate bodies are parallel to each other.

12. The heat dissipation device as claimed in claim 6, wherein the perforations are parallel to each other.

* * * * *